United States Patent [19]

Koike et al.

[11] Patent Number: 4,500,915
[45] Date of Patent: Feb. 19, 1985

[54] COLOR SOLID-STATE IMAGER

[75] Inventors: Norio Koike, Suginami; Toshihisa Tsukada, Nerima; Toru Baji, Kokubunji; Akira Sasano, Nishitama, all of Japan

[73] Assignee: Hitachi, Ltd., Tokyo, Japan

[21] Appl. No.: 423,446

[22] Filed: Sep. 24, 1982

[30] Foreign Application Priority Data

Oct. 9, 1981 [JP] Japan ............................ 56-149492[U]

[51] Int. Cl.³ .............................................. H04N 9/07
[52] U.S. Cl. ........................................................ 358/44
[58] Field of Search ............................. 358/44, 48, 43

[56] References Cited

U.S. PATENT DOCUMENTS 4,320,413 3/1982 Takemura .............................. 358/44

FOREIGN PATENT DOCUMENTS

158577 7/1981 Japan ..................................... 358/44

Primary Examiner—Richard Murray
Attorney, Agent, or Firm—Antonelli, Terry & Wands

[57] ABSTRACT

The present invention consists in providing a CCD type color solid-state imager in which color signals respectively separated in time can be derived from picture elements for respective colors arrayed in the shape of a matrix and which permits interlacing without degrading a resolution and without causing image lag. Concretely, pairs of CCD shift registers which are electrically insulated and separated and which run in the vertical direction are arrayed in the horizontal direction, signal charges stored in adjacent picture elements are sent into the individual opposing CCD registers through transfer gates arrayed in a checkerboard pattern, and signal charges transferred in time sequence are distributed to a plurality of CCD shift registers which run in the horizontal direction, whereby a CCD type color solid-state imager having a high resolution and exhibiting no image lag is obtained.

4 Claims, 16 Drawing Figures

COLOR SOLID-STATE IMAGER

BACKGROUND OF THE INVENTION

The present invention relates to a CCD type color solid-state imager wherein photoelectric conversion elements for producing a plurality of color signals, and scanners (hereinbelow, termed "CCD shift registers") constructed of charge coupled devices (hereinbelow, termed "CCDs") and for taking out optical information from the respective elements are integrated on a semiconductor substrate.

Figure 1:
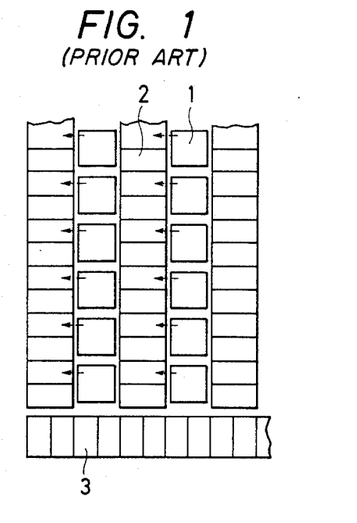
FIG. 1 is a diagram showing the arrangement of a prior-art CCD type solid-state imager.

A solid-state imager requires an imaging plate which has a resolving power comparable to that of an imaging electron tube used in the current television broadcast. This necessitates about 500×500 photoelectric conversion elements constituting a matrix of picture elements, and scanning elements corresponding thereto. Accordingly, the solid-state imager is fabricated by the use of the MOS large-scale integrated circuit technology with which high density of packaging is comparatively easy. In general, a CCD type imaging device (photodiode+CCD shift register), a MOS type imaging device (photodiode+MOS shift register), or the like is used as the constituent elements. FIG. 1 shows the fundamental arrangement of a CCD type solid-state imager which is featured by low noise. Numeral 1 designates a photoelectric conversion element which is made of, for example, a photodiode. Numerals 2 and 3 designate a vertical CCD shift register and a horizontal CCD shift register which serve to read out photo signals, stored in the photoelectric conversion elements, to an output end.

Figure 2:
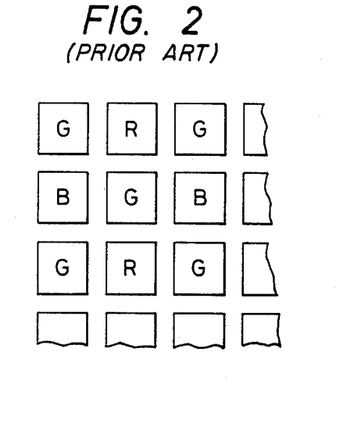
FIG. 2 is a diagram showing a conventional filter assembly of the three primary colors.

In a case where a color television camera is constructed using the solid-state imager in FIG. 1, three imaging plates are usually needed for converting light rays of red, green and blue into electric signals respectively. The color camera employing the three solid-state imaging plates, however, requires a color separating optical system for separating a subject into the three primary colors of red, green and blue, a special imaging lens, etc., which form serious obstacles to rendering the camera small in size and low in price. In this regard, there has been proposed a method wherein, as shown in FIG. 2 by way of example, respective photoelectric conversion elements which constitute an imaging picture element matrix are held in correspondence with color filters R, G and B which are arrayed in a checkerboard pattern and which transmit only light rays of red (R), green (G) and blue (B) respectively, whereby signals of the three primary colors are derived from a single imaging plate (refer to the official gazette of Japanese Laid-open Patent Application No. 51-112228). The color filter assembly of this arrangement has the green filters arrayed in the horizontal and vertical directions of the imaging plate in a manner to fill up the interstices of the color filters R and B. Therefore, even when the number of picture elements of the solid-state imaging plate is small, a color solid-state imager whose resolution is little deteriorated can be obtained, and the arrangement is very excellent as a system for deriving the color signals from the single imaging plate. Further, this color filter system has already been adopted in a MOS type solid-state imager, and a color solid-state imager with a single plate has been reported (N. Koike et al., "An NPN Structure 484×384 MOS Imager for a Single-Chip Color Camera", 1979 ISSCC Digest Tech Papers, 192).

Figure 3:
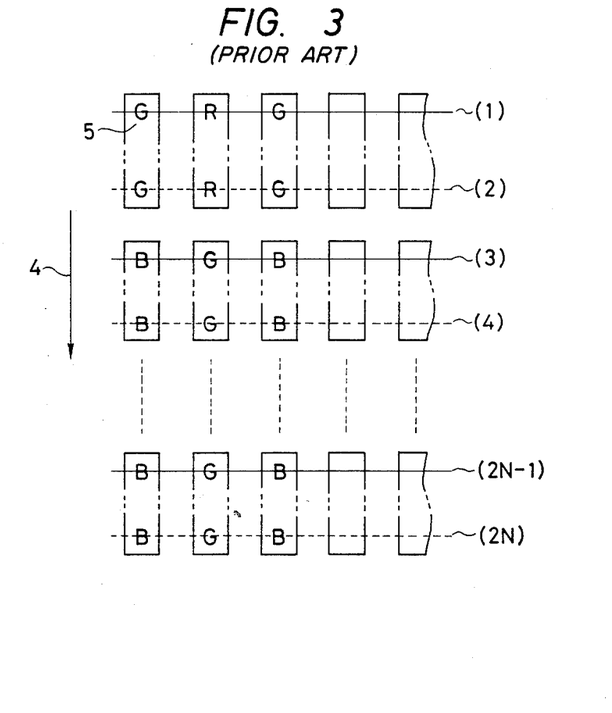
FIG. 3 is a diagram showing the scanning system and the picture element arrayal of a prior-art CCD type color solid-state imager in which the CCD type solid-state imager of FIG. 1 and the color filter assembly of FIG. 2 are combined.

If the color filter system stated above can be adopted for the CCD type solid-state imager having the advantage of low noise, a color solid-state imager of very high sensitivity will be realizable. However, in a case where this color filter system is applied to the CCD type imager shown in FIG. 1, the following inconveniences ascribable to the operation and construction of the CCD type device occur unlike the aforementioned case of the MOS type (FIG. 3):

(1) The interlaced scanning is carried out in the vertical direction 4. In this imager, by way of example, the signals of picture elements in odd-numbered rows (1, 3, 5, . . . , 2N−1) are read out in the first field, and those of picture elements in even-numbered rows (2, 4, 6, . . . , 2N) are read out in the second field. As a result, in the first field of the next frame, the signals of rows not read out in the immediately preceding field (that is, odd-numbered rows) are read out in superposition on new signals (this phenomenon is usually called "image lag"). Since the solid-state imager has a high switching speed, one of its important features is that the image lag does not develop. In actuality, however, the image leg attributed to the interlaced read-out system as above described develops.

(2) In the vertical direction, the filters of the same color are disposed over two rows of picture elements 5. Therefore, in spite of employing the interlaced scanning and the checkerboard-like color filters, only a resolution which corresponds to half of the number of picture elements can be attained in the vertical direction. In consequence, the picture quality degrades. Along with the image lag explained in Item (1), this forms a serious cause for hindering the solid-state imager from being put into practical use.

As methods for improving these problems, regarding the image lag described in Item (1), it has been known to prevent the occurrence of the image lag by the interlaced scanning system which selects two rows of picture elements at the same time (refer to the official gazette of Japanese Laid-open Patent Application No. 51-57123). Regarding the resolution described in Item (2), it has been known that the degradation of the resolution can be prevented by a method in which the filter of one color is held in correspondence with a single picture element also in the vertical direction and in which two rows of picture elements are simultaneously read out through a plurality of signal output lines. Accordingly, the conceptual measures on the improvements have already been proposed. It is actually impossible, however, to simply apply these measures to the CCD type solid-state imager.

The reasons will be listed below:

(1) The MOS type is of the dot address (X·Y address) system as to the read-out of signals, and can derive signal charges in any direction. In contrast, the CCD type is of the system in which signal charges are unidirectionally transferred, and actually it cannot adopt the interlaced system of the simultaneous two rows in view of the operating principle.

(2) Also in the CCD type imager, is not impossible to dispose a plurality of CCD registers for taking out signals. Since, however, the rate of aperture for incident light is low (the sensitivity is low) even in case of the single register, there occurs the side effect that the area of picture elements becomes still smaller due to the plurality of registers and that a sensitivity required in practical use cannot be attained.

As understood from the above explanation, how the foregoing two measures of improvements tentatively realized in the MOS type imager are realized in concrete forms is deemed an important problem to-be-solved of the CCD type imager having the advantage of low noise.

SUMMARY OF THE INVENTION

An object of the present invention is to construct, using CCDs, a color solid-state imager in which color signals respectively separated in time can be derived from picture elements for respective colors arrayed in the shape of a matrix and which permits interlacing without degrading the resolution and without causing the image lag.

In order to accomplish the object, in the concrete, pairs of CCD shift registers which are electrically insulated and separated and which run in the vertical direction are arrayed in the horizontal direction, signal charges stored in adjacent picture elements are sent into the individual opposing CCD registers through transfer gates arrayed in a checkerboard pattern, and signal charges transferred in time sequence are distributed to a plurality of CCD shift registers which run in the horizontal direction, whereby a CCD type color solid-state imager having a high resolution and exhibiting no image lag is obtained.

DETAILED DESCRIPTION OF THE PREFERRED EMBODIMENTS

Figure 4:
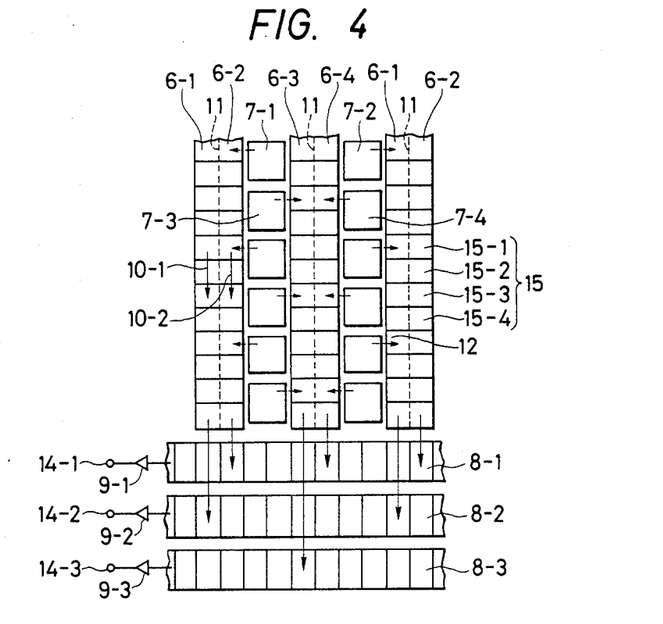
FIG. 4 is a diagram showing a CCD type color solid-state imager of the present invention.
Figure 5:
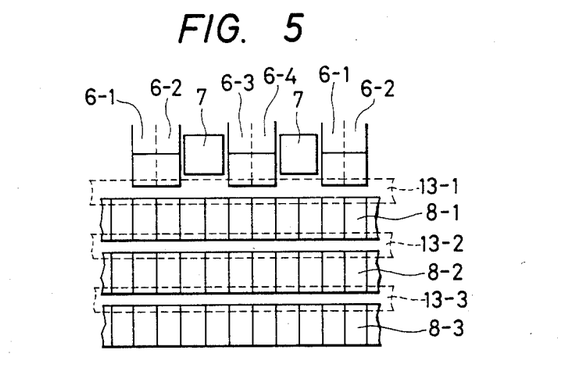
FIG. 5 is a diagram showing a horizontal CCD shift register portion in the color solid-state imager of FIG. 4.

FIG. 4 is a diagram showing the arrangement of an imaging plate which forms the skeleton of a color solid-state imager according to the present invention. (6-1, 6-2) and (6-3, 6-4) indicate vertical CCD shift registers which run in the vertical direction; 7-1, 7-2, 7-3 and 7-4 photoelectric conversion elements which are arrayed in the shape of a matrix; 8-1, 8-2 and 8-3 horizontal CCD shift registers which run in the horizontal direction; and 9-1, 9-2 and 9-3 signal output units which are constructed of charge detecting transistors etc. Here, the pair of vertical CCD shift registers are centrally provided with a separation zone 11 which electrically insulates both (channels for transferring charges). Arrow 12 indicates a gate by which charges stored in the photoelectric conversion element are sent into the vertical shift register. The photoelectric conversion element (for example, photodiode) is turned into an element which senses a specified color, by a color filter which is mounted thereon. Color filters include two kinds; the three primary color type (red, green, blue) and the complementary color type. Here, the three primary color type illustrated in FIG. 2 will be taken as an example, and a case will be considered where the first color corresponds to the elements 7-1 and 7-4, the second color to the element 7-2 and the third color to the element 7-3. Then, the signal charges of the first color are sent into the vertical registers (6-2, 6-4), the charges of the second color into the register 6-1, and the charges of the third color into the register 6-3. The color signal charges of various positions are sequentially transferred in the directions of arrows 10-1 and 10-2 by the respective vertical registers in a predetermined period (time interval of $T_y$: 63.5 $\mu$sec in the standard television operation), and the charges corresponding to every row are sent into the horizontal registers which are located at the end points of the respective vertical registers. Here, the transfer to the respective registers can be performed, for example, through transfer gates 13-1, 13-2 and 13-3 corresponding to these registers as shown in FIG. 5. As a result, the horizontal register 8-1 becomes a shift register for the first color, the register 8-2 a shift register for the second color, and the register 8-3 a shift register for the third color, so that the first color signal can be provided at the output 14-1 of the detector connected to the final stage of the corresponding register, the second color signal at the output 14-2, and the third color signal at the output 14-3. Since the horizontal registers operate at a high speed corresponding to N times the speed of the vertical registers (N corresponds to the number of photoelectric conversion elements arrayed in the horizontal direction), the signal charges of the respective colors corresponding to one row are time-sequentially provided through the outputs 14 within the time interval $T_y$. When the signal read-out corresponding to one row has finished, the signal charges of the respective colors in the next row are sent into the corresponding horizontal registers 8, and the signals of the first color, second color and third color in the next row can be obtained at the outputs 14. Thenceforth, the color signals of all the rows (N rows) are derived from the outputs 14 by similar operations.

Figure 6:
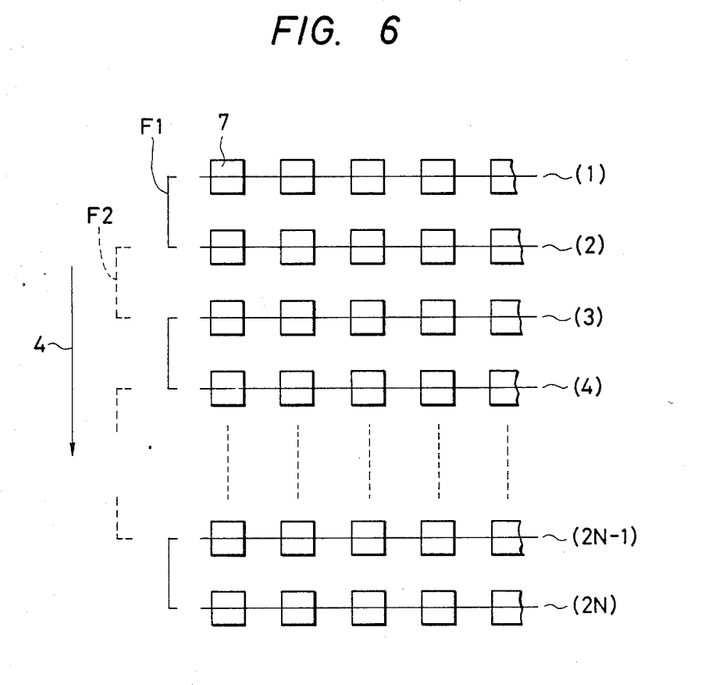
FIG. 6 is a diagram showing the scanning system and the picture element arrayal of the color solid-state imager of the present invention shown in FIG. 4.

1 bit of the CCD shift register is usually composed of four electrodes 15-1, 15-2, 15-3 and 15-4, and one color signal is stored and transferred by 1 bit. In the present arrangement, the signals of picture elements, e.g., 7-3 and 7-4 in the two adjacent rows are distributively sent into the left and right vertical registers 6-3 and 6-4. In addition, the signals of picture elements, e.g., 7-1 and 7-2 shifting by one row are respectively sent into the vertical registers 6-2 and 6-1. Accordingly, each register stores and transfers the signal charges of one color in 1 bit (4 electrodes) likewise to the case of the prior art. It is consequently permitted to solve the two problems described before. (1) The interlaced scanning for simultaneously reading out two rows can be executed, and the occurrence of the image lag can be prevented. More specifically, as illustrated in FIG. 6, sets (1, 2), (3, 4), (5, 6), ... of the adjacent two rows can be simultaneously read out in the first field (F1), and sets (2, 3), (4, 5), (6, 7), ... shifting by one row can be read out in the second field (F2). (2) Since the interlaced scanning of reading out two rows simultaneously can be executed, the restriction that the same color filters are disposed over two picture elements in the vertical direction, this restriction having been inevitable in the prior-art interlaced scanning of reading out one row, is eliminated, and it is permitted to dispose the color filters different for the respective picture elements 7 also in the vertical direction, as already stated in the description of the operation of the present embodiment. That is, the resolution in the vertical direction can be enhanced to double that of the prior art.

Figure 7:
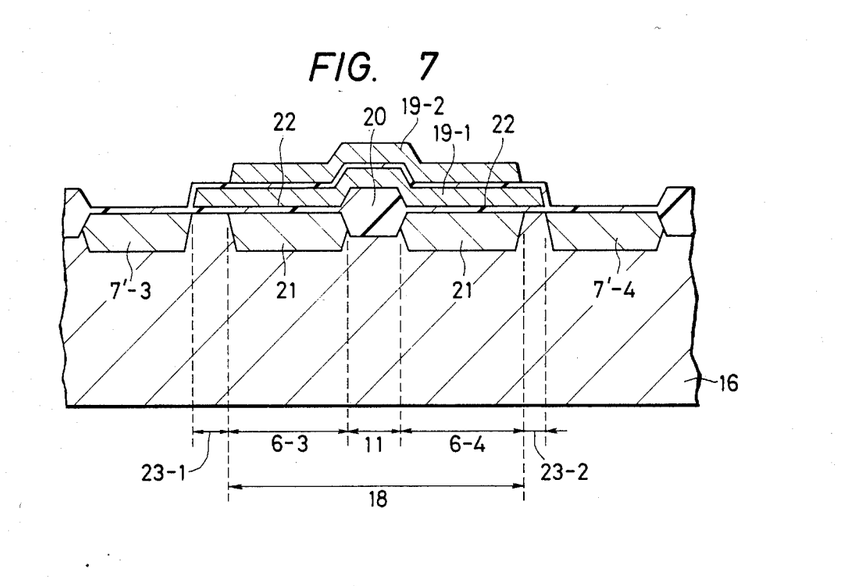
FIG. 7 is a diagram showing the structure of the color solid-state imager of the present invention shown in FIG. 4.

Now, there will be described a device structure for concretely realizing the construction of the above embodiment. FIG. 7 is a diagram showing the structure of a vertical shift register region which is fundamental to the present invention (here, two picture elements necessary for the explanation are illustrated). Numeral 16 designates a substrate of, e.g., the p-type, and symbol 7' (7'-3, 7'-4) denotes a photodiode made of, e.g., an n-type impurity. Numeral 18 indicates a region in which one set of opposing vertical CCD shift registers 6-3 and 6-4 are formed. 19-1 and 19-2 indicate two layers of electrodes which constitute a register and which are made of, e.g., polycrystalline silicon. Numeral 20 indicates an insulating oxide film (of, e.g., $SiO_2$) which electrically insulates and separates the identical register fabricated of the electrodes, so as to form the one set of opposing registers, and which corresponds to the separation zone 11 shown in FIG. 4. In addition, numeral 21 indicates a low-concentration n-type impurity layer which is provided in order to make the registers the buried type (this layer may be omitted in case of making the registers the surface type), numeral 22 a gate oxide film which insulates the electrode and the substrate, symbol 23-1 a transfer gate region by which signal charges stored in the photodiode 7'-3 are sent into the register 6-3 (here, the electrode for the register serves also as this gate), and symbol 23-2 a transfer gate region by which stored charges in the photodiodes 7'-4 are sent into the register 6-4. When a high "1" level voltage is applied to the first layer of electrode 19-1 by utilizing a vertical blanking period or the like, the transfer gates 23-1 and 23-2 fall into their conductive states at the same time, and the stored changes of the photodiodes 7'-3 and 7'-4 are sent into the respective registers 6-3 and 6-4 through these gates. Thereafter, they are successively transferred within the registers 6-3 and 6-4 by clock pulses of, e.g., 15.7 kHz which reciprocate between an intermediate "1" level (a voltage level lower than the first-mentioned "1" level) and a "0" level (for example, 0 V).

Figure 8:
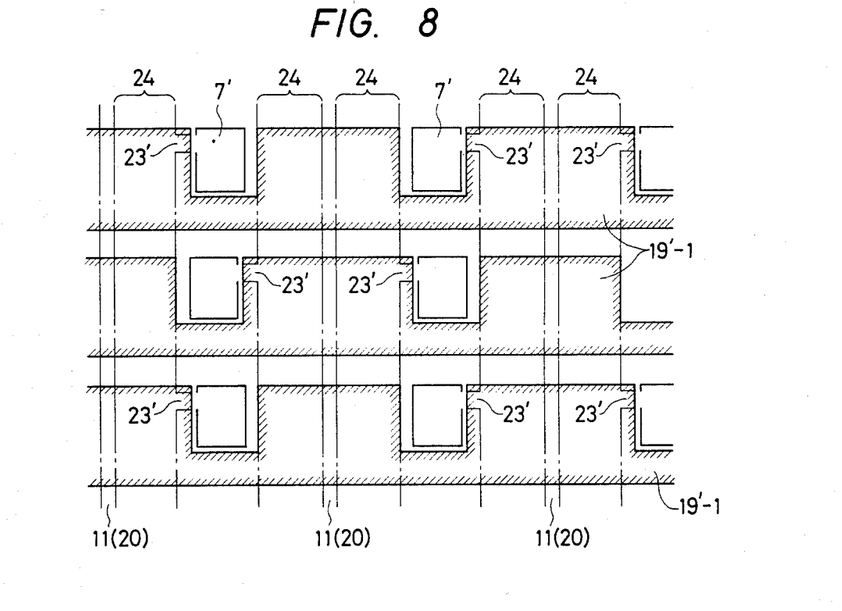
FIG. 8 is a diagram showing the plan layout configuration of the color solid-state imager of the present invention shown in FIG. 4.

The plan layout configuration of the picture element structure shown in FIG. 7 is illustrated in FIG. 8. Symbol 7' denotes the photodiode region, symbol 19'-1 the first (the first layer of) electrode which constitutes the vertical CCD register (the second layer of electrode is not shown to the end of avoiding complicacy of the drawing), and symbol 23' the transfer gate region. Regarding the first electrodes which serve also as the transfer gates, the area of the electrode regions spreads in a checkerboard pattern in correspondence with the arrayal of the photodiodes in an interdigitated pattern.

The imager shown in FIGS. 7 and 8 can be fabricated by quite the same two-layer polycrystalline silicon processing technology as in the prior art. Now, the manufacturing process will be briefly described. First, on the surface of a p-type silicon substrate, a thick oxide film of, e.g., 0.5–1.0 μm (region other than channels 24, and corresponding to separation zones 20 (11) etc.) is formed by the LOCOS method (Local Oxidation of Silicon). Subsequently, phosphorus atoms, for example, are diffused to form a burying n-type impurity layer, whereupon polycrystalline silicon for first and second layers of CCD electrodes (for example, 0.3–0.5 μm thick) is formed. Subsequently, an n-type impurity layer for photodiodes is formed by diffusing, e.g., phosphorus atoms. Lastly, an insulating oxide film, for example, about 0.5 μm thick is formed by the CVD process or the like, whereupon a metal film of Al or the like (for example, 0.6–1.0 μm thick) is evaporated so as to form predetermined wiring.

In the above, the arrangement, structure, manufacturing method etc. of the CCD type color imager of the present invention have been described in outline. As regards the color imager of the present invention, various arrangements and structures can be considered besides the embodiment shown in FIGS. 4, 7 and 8. Hereunder, these color imagers will be explained in conjunction with embodiments.

Figure 9:
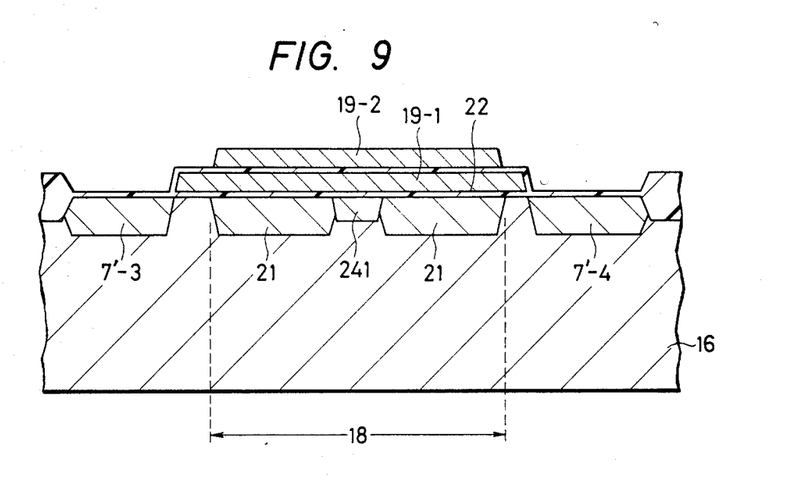
FIGS. 9 and 10 are diagrams each showing a structure, different from that of FIG. 7, for realizing the color solid-state imager of the present invention in FIG. 4.

FIG. 9 is a diagram showing a CCD type color imager of the structure in which the insulating and separating member formed of the oxide film shown in FIG. 7 is replaced with a p-type (e.g., boron atom) impurity layer 241. In the present structure, a potential barrier for electrons is formed between the two opposing CCD shift registers by the impurity layer. Therefore, the signal charges (electrons) which are transferred through both the shift registers cannot enter the registers 6-3 and 6-4 adjoining each other, and the electrical insulation between both the CCDs can be effected. In case of the present structure, the layout configuration of the electrodes etc. is the same as in FIG. 8, and the separation zone 11 shown in the figure may be deemed the p-type impurity layer, not the oxide film.

Figure 10:
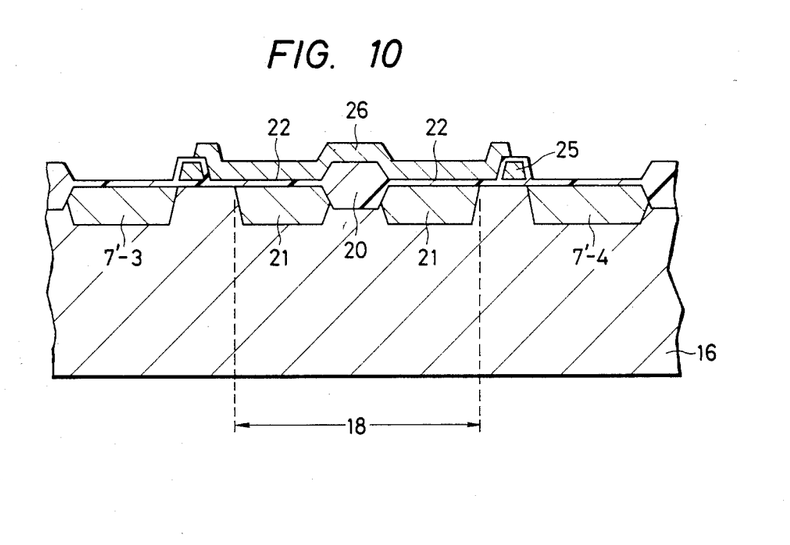

FIG. 10 shows an embodiment in the case where the structure shown in FIG. 7 is constructed of three layers of polycrystalline silicon as reported in 1980 ISSCC Dig. Tech. Papers, 24 (Y. Ishihara et al., "CCD image sensor for single sensor color camera"). Numeral 25 (25-1, 25-2) indicates a gate electrode by which photo charges stored in the photodiode are transferred to the vertical shift register, and which is formed of the first layer of polycrystalline silicon in this example. Here, the vertical shift register is formed of polycrystalline silicon of the second layer 26 and the third layer (not shown because this layer is hidden normally to the plane of sheet by the second layer). In addition, numeral 20 indicates an insulating oxide film which separates the vertical shift register into two 6-3 and 6-4. Since the imager of the present structure uses the three layers of polycrystalline silicon, it necessitates a three-layer polycrystalline silicon process in which the formation of one more layer of polycrystalline silicon is added to the foregoing processing technique.

Figure 11:
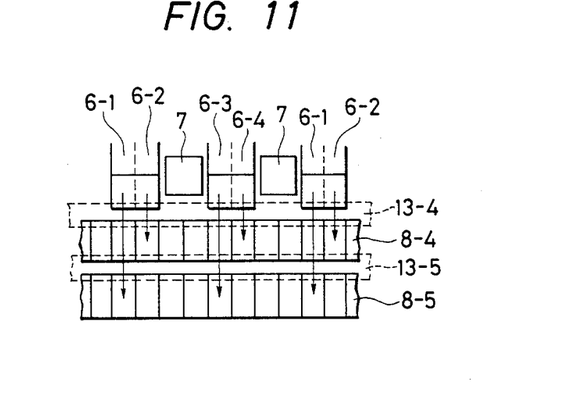
FIGS. 11 and 12 are diagrams each showing a horizontal CCD shift register portion different from that of FIG. 5.
Figure 12:
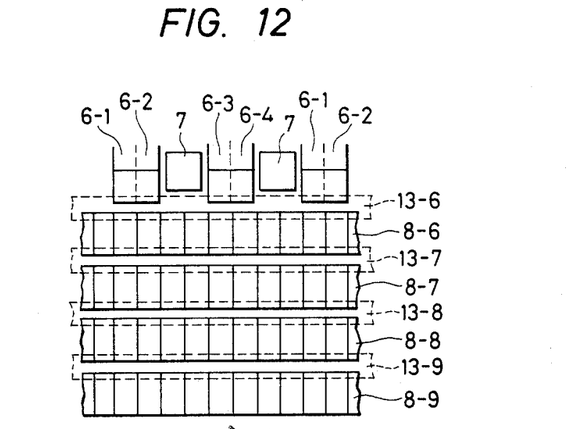

While, in the above, the arrangement and structures of the vertical CCD register portion have been described, the arrangement of the horizontal CCD register is not restricted to the three-row system shown in FIG. 5, but the number of rows differs depending upon the kinds of color filters to be used. First, in case of adopting the color filters as shown in FIG. 2, a two-row system as shown in FIG. 11 can be considered in addition to the standard three-row system (FIG. 5). In this case, a horizontal register 8-4 becomes a register for the first color which serves as a brightness signal and the filters of which are arrayed in a number double that of the filters of each of the other colors (that is, the signals needs to be taken out every time). Another register 8-5 becomes a register for the second and third colors (that is, the signals of the second and third colors are alternately transferred). Here, symbols 13-4 and 13-5 denote transfer gates for the respective registers 8-4 and 8-5. In the next place, a four-row system as shown in FIG. 12 can be considered in case of adopting complementary color filters in which the four kinds of colors of, e.g., cyan, yellow, green and white are allotted to the respective photodiodes (there are other complementary color types composed of various colors). Here, a horizontal CCD shift register 8-6 functions for the first color (e.g., cyan), 8-7 for the second color (e.g., yellow), 8-8 for the third color (e.g., green), and 8-9 for the fourth color (e.g., white). Symbols 13-6, 13-7, 13-8 and 13-9 denote transfer gates for the respective registers 8-6, 8-7, 8-8 and 8-9. As understood from these embodiments, the horizontal CCD shift registers may be disposed in 2-4 rows as needed (over 4 rows in some cases).

As described above in detail in conjunction with the embodiments, in the solid-state imagers of the present invention, pairs of opposing vertical CCD shift registers are arrayed in the horizontal direction, and a plurality of horizontal CCD shift registers are arrayed at the end points of the respective vertical shift registers, whereby color signals from respective color elements arrayed in the shape of a matrix can be derived. As a result, it becomes possible to execute the interlaced scanning of reading out two rows at the same time and to dispose filters of colors different from each other in adjacent picture elements. That is to say, a color solid-state imager exhibiting no image lag and having a high resolution is allowed to be constructed of CCDs which are originally featured by low noise, and the effects of the present invention are very great in practical use.

While the above description has been directed toward the interline-transfer type which is high in the density of integration among CCD imagers, obviously the present invention is also applicable to another type or the frame-transfer type within a scope not departing from the gist of the present invention. Also in case of an imager having a double-layered structure wherein the photodiode above described is replaced with a photoconductive thin film as the photoelectric conversion element, the present invention is applicable as it is. In this case, the photodiodes in the foregoing embodiments may be replaced with the photoconductive thin film elements. Now, there will be described methods of driving such solid-state imagers.

Figure 13:
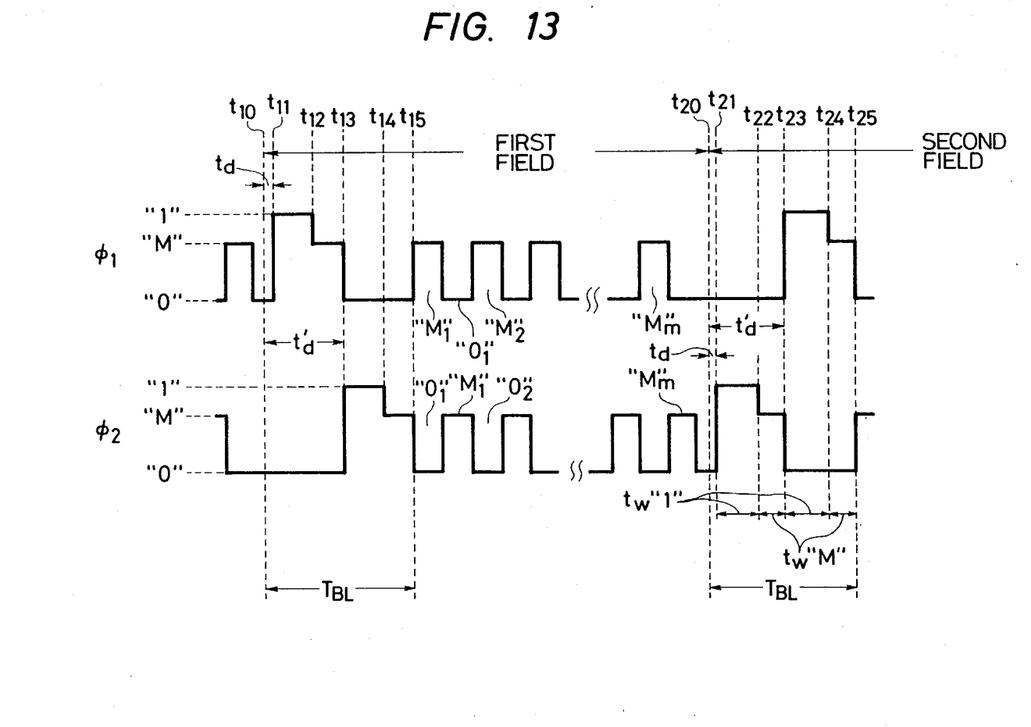
FIG. 13 is a diagram showing a driving system for the solid-state imager of FIG. 4.

FIG. 13 shows a time chart of clock pulses for driving the device shown in FIG. 4.

$\phi_1$ indicates the first clock pulse for driving the vertical CCD shift register, and $\phi_2$ another, second clock pulse differing in phase from $\phi_1$.

Figure 14:
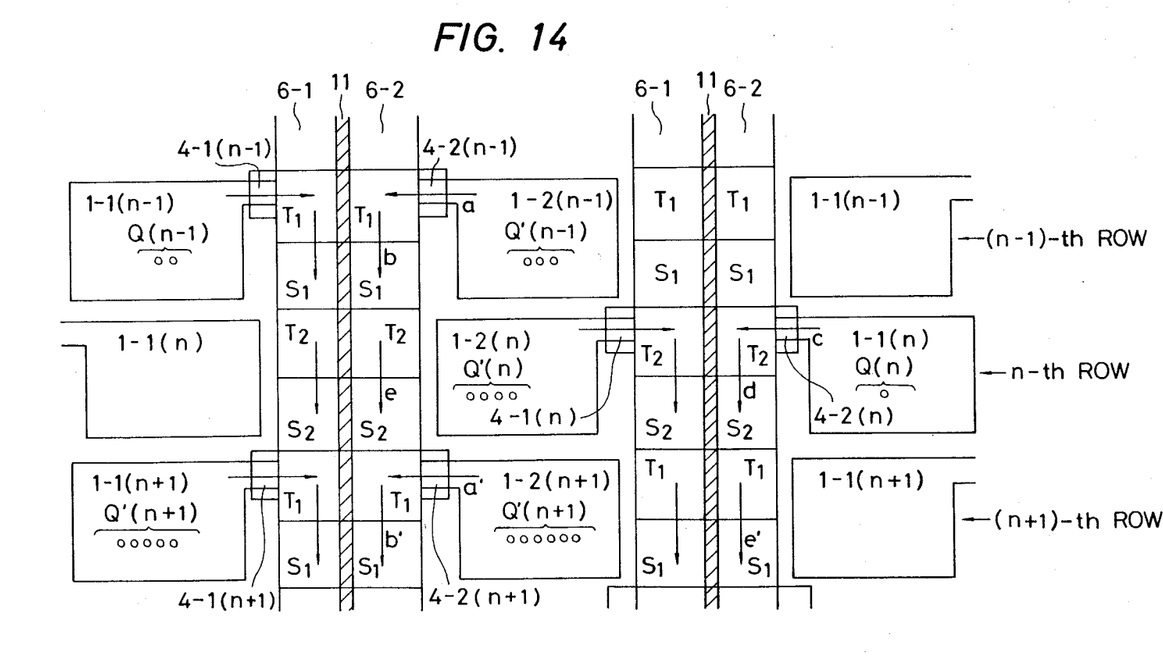
FIG. 14 is a diagram showing an example of the plan layout of the arrangement shown in FIG. 4.

FIG. 14 shows the plan layout configuration of the device arrangement shown in FIG. 4. Symbols 6-1 and 6-2 denote CCD vertical shift registers, the electrical insulation of which is executed by a separation zone 11 (for example, formed by an impurity identical in the conductivity type to, and higher in concentration than, a substrate). Symbols 4-1 and 4-2 denote transfer gate regions which serve to send photo signal charges stored in photodiodes, into the shift registers 6-1 and 6-2 in one field period. Each of the shift registers (6-1, 6-2) is constructed of a storage electrode $S_1$ and transfer electrode $T_1$ on which the clock pulse $\phi_1$ is impressed, and a storage electrode $S_2$ and a transfer electrode $T_2$ on which the clock pulse $\phi_2$ is impressed.

Hereunder, the operation of transferring signal charges will be described with reference to FIGS. 13 and 14. It is supposed that the starting point of the first field is at a time $t_{10}$, while the starting point of the second field is at a time $t_{20}$. It is supposed that, in the first field, the "1" level of the clock pulse $\phi_1$ is generated with a delay of a predetermined time interval $t_d$ from the starting time $t_{10}$, while the "1" level of the clock pulse $\phi_2$ is generated with a delay of a time interval $t'_d$ from the starting time $t_{10}$. It is supposed that, in the second field, conversely to the above, the "1" level of the clock pulse $\phi_2$ is generated with a delay of the predetermined time interval $t_d$ from the starting time $t_{20}$, while the "1" level of the clock pulse $\phi_1$ is generated with a delay of the time interval $t'_d$ from the starting time $t_{20}$. Here, the durations (pulse widths) of the "1" level of the clock pulse and the following "M" level and "0" level may be set at any values within the range in which the total time interval of them becomes shorter than the vertical blanking period ($T_{BL} \approx 2.7$ msec) provided every field. The total time interval $T_w$ of the pulse widths is expressed by the following equation:

$$T_w = 2 \cdot (t_{w\text{-}1\text{"}} + t_{w\text{-}M\text{"}}) + t_d \tag{1}$$

Regarding both the clock pulses $\phi_1$ and $\phi_2$, the repeated "M" and "0" levels subseqent to the vertical blanking period $T_{BL}$; "$M_1$", "$0_1$", "$M_2$", "$0_2$", . . . "$M_m$", "$0_m$" are pulses for driving the vertical CCD shift registers. Usually, the repetition frequency of "M", "0" is 15.7 kHz. The clock pulse $\phi_1$ is applied to the storage electrode $S_1$ and transfer electrode $T_1$ which constitute the vertical CCD shift register, while the clock pulse $\phi_2$ is applied to the other set of electrodes $S_2$ and $T_2$.

Referring to FIGS. 13 and 14, when the "1" level of a clock pulse $\phi_1$ is applied to transfer gates 4-1 (n−1) and 4-2 (n−1) and the electrodes $T_1$ and $S_1$ at a time $t_{11}$ in the first field, photo signal charges $Q(n-1)$ and $Q'(n-1)$ stored in the photodiodes 1-1(n−1) and 1-2(n−1) of the (n−1)-th row in the period of 1 field are respectively sent to the electrodes $T_1$ of the vertical CCD shift registers 6-1 and 6-2 through the transfer gates 4-1 (n−1) and 4-2(n−1) in the interval of the "1" level ($t_{11}$–$t_{12}$) (a). Further, the charges flow into the electrodes $S_1$, lower in potential than the electrodes $T_1$, in an interval $t_{11}$–$t_{13}$ (b). The higher and lower potentials here are established in such a way that, in the process for fabricating the device, the surface parts of the semiconductor substrate under the electrodes $T_1$ and $T_2$, for example, are ion-implanted with an impurity identical in the conductivity type to the substrate and higher in concentration than in the substrate, whereby the potentials under the electrodes $T_1$ and $T_2$ are respectively made higher than those under the electrodes $S_1$ and $S_2$.

Next, when the "1" level of the clock pulse $\phi_2$ is applied to the transfer gates 4-1(n) and 4-2(n) and the electrodes $T_2$ and $S_2$ at a timing $t_{13}$, photo signal charges $Q'(n)$ and $Q(n)$ stored in the photodiodes 1-2(n) and 1-1(n) of the n-th row are sent to the transfer electrodes $T_2$ of the vertical CCD shift registers 6-1 and 6-2 through the transfer gates 4-1(n) and 4-2(n) in the interval ($t_{13}$–$t_{14}$) (c). Further, the charges flow into the electrodes $S_2$, lower in potential than the electrodes $T_2$, in an interval $t_{14}$–$t_{15}$ (d).

On the other hand, at the time $t_{13}$, the clock pulse (which is negative) to the electrodes $T_1$ and $S_1$ is dropt from the "M" level to the "0" level. At the same time $t_{13}$, the clock pulse of the "1" level is applied to the adjacent (n-th row) electrodes $T_2$ and $S_2$. Therefore, the n-th row becomes lower in potential than the (n−1)-th row, and the charges $Q(n-1)$ and $Q'(n-1)$ of the photodiodes 1-1(n−1) and 1-2(n−1) having been temporarily stored under the electrode $S_1$ of the left vertical CCD shift register move to the electrode $T_2$ of lower potential and then flow into the electrode $S_2$ of still lower potential (e). The interval in which they flow is $t_{13}$–$t_{15}$.

As understood from the above description, the transfer e and the transfer d are carried out in substantially the same intervals ($t_{13}$–$t_{15}$ and $t_{14}$–$t_{15}$), and they end at the same time ($t_{15}$). As a result, the signals of the photodiodes of the (n−1)-th row and the n-th row are arrayed under the electrodes $S_2$ of the same row (n). When the charge transferring clocks "$M_1$"."$0_1$", "$M_2$"."$0_2$", ... are applied to the respective electrodes on the vertical CCD shift registers at the time $t_{15}$, the photodiode signal charges of the adjacent two rows of the (n−1)-th row and n-th row are sent to the (n+1)-th row, (n+2)-th row, ... at the same time, and they are simultaneously sent into the horizontal CCD shift registers disposed below the final row. Here, by way of example, the signal charges of the (n−1)-th row (even-numbered row) are sent into the horizontal CCD shift register 8-1 (FIG. 4), and the signal charges of the n-th row (odd-numbered row) into the registers 8-2 and 8-3. Thus, the signal charges of all the photodiodes of the adjacent two rows (n−−1, n) are transferred to the electrodes of the same row at the same time within the respective horizontal CCD shift registers. Accordingly, the signal charges of the photodiodes of the respective rows can be provided at the outputs of the horizontal CCD shift registers at the same time. The series of operations above stated proceed simultaneously for the respective rows. Further, owing to the checkerboard-like configuration, by way of example, the charges of even-numbered rows enter the horizontal CCD shift registers 8-1, and those of odd-numbered rows enter the registers 8-2 and 8-3.

On the other hand, in the second field, conversely to the case of the first field, the "1" level of the clock pulse $\phi_2$ is applied to the respective electrodes first (time $t_{21}$), and the "1" level of the clock pulse $\phi_1$ next ($t_{23}$). As a result, in the interval $t_{21}$–$t_{23}$, the photo signal charges having been stored in the photodiodes 1-2(n) and 1-1(n) of the n-th row (The charges are different from those in the first field. Before the time $t_{21}$–$t_{23}$, the charges in the first field have already been sent into the horizontal CCD shift registers by the transferring clocks "$M_1$"."$0_1$", "$M_2$"."$0_2$", ... "$M_m$"."$0_m$".) flow into the underlying parts of the electrodes $S_2$ (this transferring operation is represented by the same symbols c and d as in the case of the first field). Next, the "1" level of the clock pulse $\phi_1$ is applied at the time $t_{23}$, whereby the signal charges $Q(n+1)$ and $Q'(n+1)$ of the photodiodes of the (n+1)-th row flow to the underlying parts of the electrodes $S_1$ of the (n+1)-th row in an interval $t_{23}$–$t_{25}$ (a', b'). Simultaneously, the "M" level of the clock pulse $\phi_2$ (negative pulse) is dropt to the "0" level at the time $t_{23}$. Herein, since the potentials of the clock $\phi_1$ applied to the (n+1)-th row are "1" and "M", the potential of the (n+1)-th row becomes lower than that of the n-th row, and the potentials having been temporarily stored under the electrodes $S_2$ of the n-th row in the right vertical CCD shift registers are transferred under the electrodes $S_1$ of the (n+1)-th row (e'). As a result, in the second field, the signal charges of the photodiodes of the n-th row and (n+1)-th row are arrayed under the electrodes $S_1$ of the (n+1)-th row. When transferring clock pulses "$M_1$"."$0_1$", "$M_2$"."$0_2$", ... "$M_m$"."$0_m$" starting from a time $t_{25}$ are impressed on the respective electrodes of the vertical CCD shift registers, these charges are sent to the (n+2)-th, (n+3)-th rows ... at the same time. By way of example, the signal charges of the n-th row (odd-numbered row) are sent into the horizontal CCD shift register 8-1 (FIG. 4), and those of the (n+1)-th row (even-numbered row) into the horizontal CCD shift registers 8-2 and 8-3.

As understood from the operations explained above, owing to such system for driving the device, in the first field, the signal charges of the photodiodes of the adjacent two rows (rows n−1, n) can be read cut as a set, while in the second field, the signal charges of the two rows (rows n, n+1) shifting by one row from the first field can be read out as a set. As stated before, among the signal charges of the two rows (rows n−1, n) transferred in the first field, those of the (n−1)-th row (even-numbered row) are sent into the horizontal CCD shift register (8-1), and those of the n-th row (odd-numbered row) are sent into the registers 8-2 and 8-3, and among the signal charges of the two rows (rows n, n+1) transferred in the second field, those of the n-th row (odd-numbered row) are sent into the horizontal CCD shift register (8-1), and those of the (n+1)-th row (even-numbered row) are sent into the registers 8-2 and 8-3. As a result, the signal charges of all the rows are transferred to the respective horizontal CCD shift registers (8-1, 8-2, 8-3). That is, by adopting the driving system of the present invention, it becomes possible to actually drive the device, as shown in FIG. 4, which is provided with the plurality of vertical CCD shift registers (further, the horizontal CCD shift registers).

While, in the present embodiment, the method has been explained in which the signal charges of the photodiodes of two rows are distributed to the two horizontal CCD shift registers, a single horizontal CCD register suffices when a 3-phase CCD shift register or the like is used as the horizontal CCD shift register. In this case, both the signals of the two rows are successively transferred within the identical horizontal CCD shift register. Therefore, the signal charges of the two rows may be separated into the time series signals of the respective rows by performing sampling in the output portion of the horizontal CCD shift register.

Figure 15:
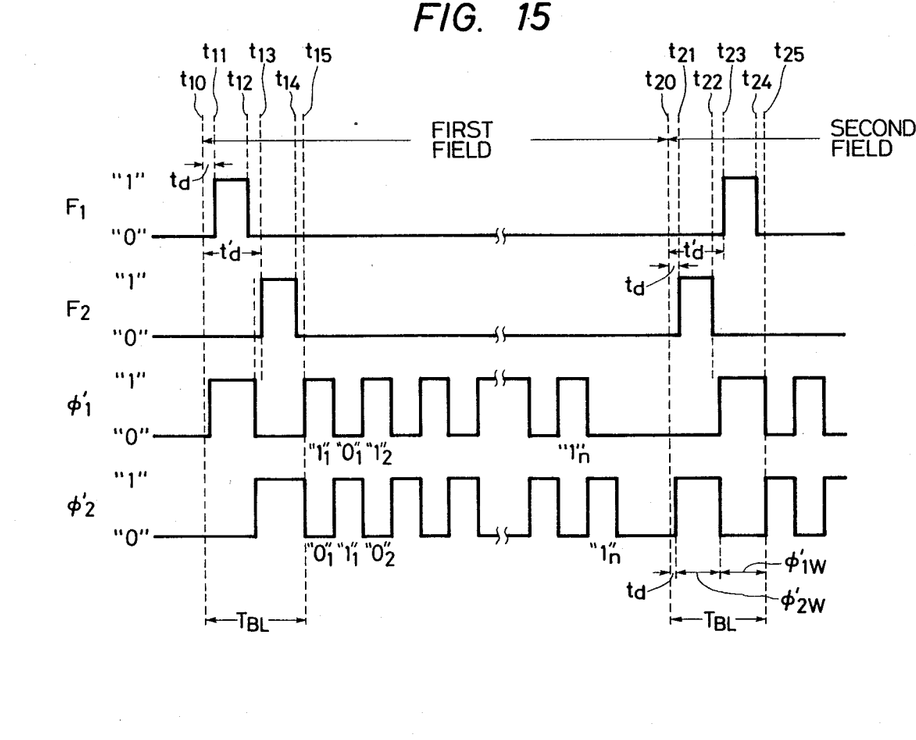
FIG. 15 is a diagram showing a driving system different from that of FIG. 13.
Figure 16:
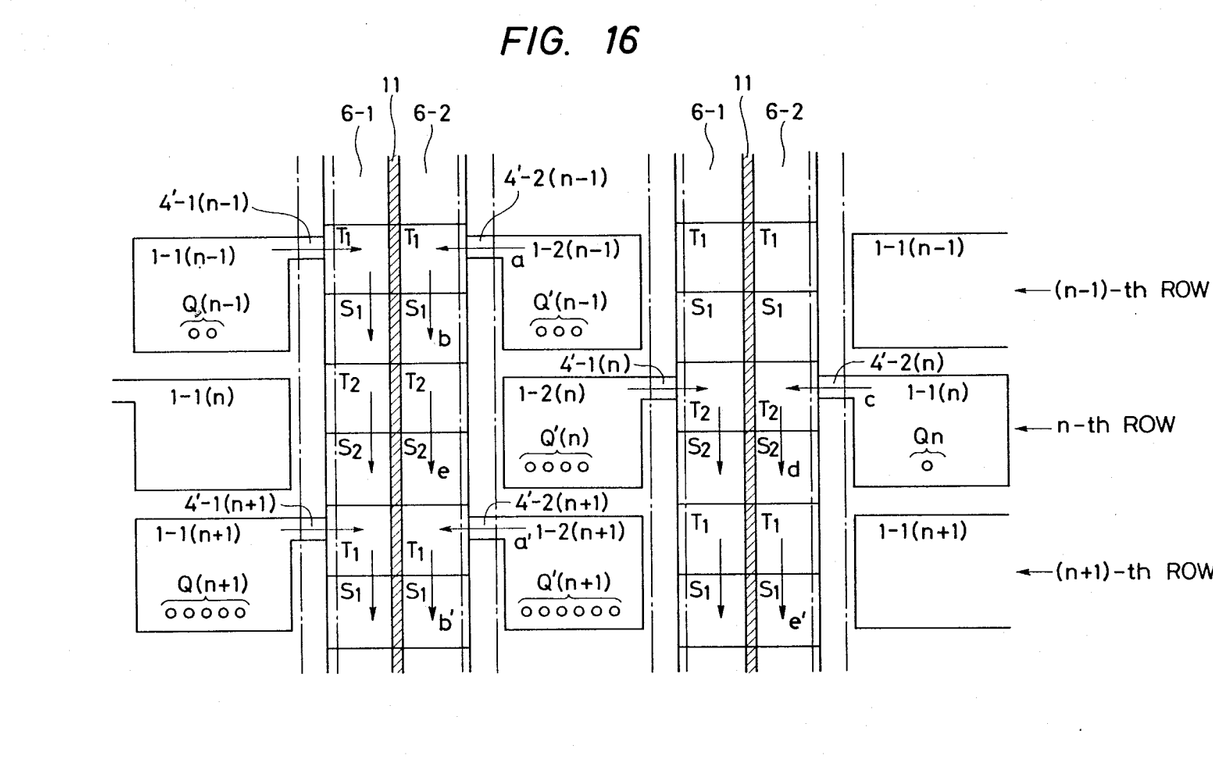
FIG. 16 is a diagram showing the plan layout of the conceptual arrangement shown in FIG. 4, different from that of FIG. 14.

The driving pulses shown in FIG. 13 possess the three levels of "1", "M" and "0". However, in a case where as shown in FIG. 16, the transfer gates 4'-1 and 4'-2 of the imager are constructed of electrodes different from those constituting the vertical CCD shift registers 6-1 and 6-2, driving pulses having the two levels of "1" and "0" levels as shown in FIG. 15 are used. Also in this pulse system, the phase relations of the two-phase clock pulses in the respective fields as form the skeleton of the driving system of the present invention are quite the same as in the case of FIG. 15, $F_1$ and $F_2$ indicate transfer gate pulses for enabling and disabling the transfer agates 4'-1 and 4'-2, and they correspond to the "1" levels of the 2-phase driving pulses in FIG. 14. The periods of the pulses $F_1$ and $F_2$ are equal to a field frequency (usually, 50 Hz or 60 Hz). The "1" level of the pulse $F_1$ is generated with a delay of $t_d$ from the starting time $t_{10}$ of the first field, while the "1" level of the pulse $F_2$ is generated with a delay of $t'_d$ from $t_{10}$. In the second field, the "1" level of the pulse $F_1$ is generated with a delay of $t'_d$ from a starting point $t_{20}$, and the "1" level of the pulse $F_2$ with a delay of $t_d$ from the starting point $t_{20}$. As in the foregoing, these pulses $F_1$ and $F_2$ need to be received in the vertical blanking period ($T_{BL}$) and to fulfill the relationship:

$$T_{BL} > t_d + \phi_1 \#_w + \phi_2'_w \qquad (2)$$

(Ordinarily, equating $\phi_1'_w$ and $\phi_2'_w$ is convenient for forming the pulses.) Further, $\phi_1'$ and $\phi_2'$ indicate clock pulses for driving the electrodes S and T of the vertical CCD shift registers. Symbols 4'-1 and 4'-2 denote transfer gates by which signal charges stored in the photodiodes 1-1 and 1-2 are respectively sent into the corresponding vertical CCD shift registers 6-1 and 6-2. For example, in a case where the electrodes S and T are formed of first and second layers of polycrystalline silicon, the transfer gates 4'-1 and 4'-2 may be formed of a third layer of polycrystalline silicon, and the layout shape thereof becomes a pattern of bars (stripes) running vertically as shown by dot-and-dash lines in FIG. 16.

Although the transfer timings of signal charges are essentially the same as in case of the embodiment of FIGS. 13 and 14, the operations of the driving system of the present embodiment (second embodiment concerning the driving method) will now be briefly explained. In the first field, in an interval of time $t_{11}-t_{12}$, signal charges $Q(n-1)$ and $Q'(n-1)$ flow under the electrodes $S_1$ of the $(n-1)$-th row via a and b. In an interval of time $t_{13}-t_{15}$, charges $Q'(n)$ and $Q(n)$ flow under the the electrodes $S_2$ of the n-th row via c and d. In the interval ($t_{13}-t_{15}$), the charges $Q(n-1)$ and $Q'(n-1)$ having been temporarily stored under the electrodes $S_1$ of the $(n-1)$-th row are simultaneously transferred under the electrodes $S_2$ of the n-th row via e. As a result, at the time $t_{15}$ of the first field, the signal charges of the $(n-1)$-th and n-th rows are arrayed under the electrodes $S_2$ of the same row (n-th row), whereupon they are successively transferred via the respective row electrodes of the vertical CCD shift registers by the clock pulses $\phi_1$ and $\phi_2$. In the second field, in an interval of $t_{21}-t_{23}$, signal charges $Q(n)$ and $Q'(n)$ (which are different from the signals of the first field) flow under the electrodes $S_2$ of the n-th row via c and d. In an interval of $t_{23}-t_{25}$, signal charges $Q(n+1)$ and $Q'(n+1)$ flow under the electrodes $S_1$ of the $(n+1)$-th row via a' and b'. Simultaneously, the charges $Q'(n)$ and $Q(n)$ having been temporarily stored under the electrodes $S_2$ of the n-th row are transferred under the electrodes $S_1$ of the $(n+1)$-th row via e'. At the time $t_{25}$ of the second field, the signal charges of the n-th and $(n+1)$-th rows are arrayed under the electrodes $S_1$ of the same row (row $n+1$). Subsequently, they are successively transferred toward the horizontal CCD shift register via the respective row electrodes of the vertical CCD shift registers by the clock pulses $\phi_1$ and $\phi_2$.

While the above description has been directed toward the interline-transfer type which is high in the density of integration among CCD imagers, obviously the present invention is also applicable to another type or the frame-transfer type. Also in case of an imager having a double-layered structure wherein photoconductive amorphous films are stacked instead of photodiodes as photoelectric conversion elements, the present invention is applicable as it is. In this case, the photodiodes may be replaced with the photoconductive thin-film elements.

We claim:

1. A color solid-state imager wherein a group of photoelectric conversion elements for deriving color optical information, and a group of CCD shift registers for successively transferring optical signal charges stored in the elements are integrated on an identical semiconductor substrate; characterized in that sets of vertical CCD shift registers are provided, each set consisting of a pair of registers electrically insulated from each other and on opposite sides of an associated column of photoelectric conversion elements, said sets being periodically arrayed in a horizontal direction, and that transfer gates which belong to the respective photoelectric conversion elements are arrayed in an alternating pattern, such that the signal charges from vertically adjacent photoelectric conversion elements are sent into different ones of the pair of individual vertical CCD shift registers, and that the signal charges of respective colors successively transferred by the vertical CCD shift registers and distributively sent into a plurality of horizontal CCD shift registers which are arranged at ends of the group of vertical CCD shift registers, whereby the signal charges of 1-2 colors are provided from output ends of the respective horizontal CCD shift registers.

2. A color solid-state imager as defined in claim 1, characterized in that an oxide film is formed centrally of, and under, a CCD electrode which constitutes the vertical CCD shift registers, thereby to form one set of opposing vertical CCD shift registers insulated electrically from each other.

3. A color solid-state imager as defined in claim 2, characterized in that the oxide film includes a central portion and adjacent portions formed under the CCD electrode, the central portion having a thickness greater than the adjacent portions.

4. A color solid-state imager as defined in claim 1, characterized in that an impurity layer identical in conductivity type to the substrate and higher in concentration than said substrate is formed in that part of a major surface of said semiconductor substrate which is centrally of, and under, a CCD electrode that constitutes the vertical CCD shift registers, thereby to form one set of opposing vertical CCD shift registers insulated electrically from each other.

* * * * *